US006762822B2

(12) United States Patent
Miwa et al.

(10) Patent No.: US 6,762,822 B2
(45) Date of Patent: Jul. 13, 2004

(54) EXPOSURE APPARATUS AND MANUFACTURING METHOD USING THE SAME

(75) Inventors: Yoshinori Miwa, Tokyo (JP); Yukio Yamane, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/407,236

(22) Filed: Apr. 7, 2003

(65) Prior Publication Data

US 2003/0169408 A1 Sep. 11, 2003

Related U.S. Application Data

(62) Division of application No. 09/274,112, filed on Mar. 23, 1999, now Pat. No. 6,590,631.

(30) Foreign Application Priority Data

Mar. 25, 1998 (JP) .......................................... 10-077345

(51) Int. Cl.$^7$ ........................... G03B 27/52; G03B 27/42
(52) U.S. Cl. ............................. 355/30; 355/53; 359/507
(58) Field of Search ............................. 355/30, 53, 67, 355/77; 359/507, 509; 250/492.2; 430/5, 311; 414/935

(56) References Cited

U.S. PATENT DOCUMENTS

| 4,999,671 | A | * | 3/1991 | Iizuka ........................... 355/97 |
| 5,166,530 | A | | 11/1992 | McCleary ................ 250/492.2 |
| 5,430,303 | A | | 7/1995 | Matsumoto et al. ...... 250/492.2 |
| 5,442,163 | A | * | 8/1995 | Nakahara et al. ............ 235/381 |
| 5,559,584 | A | | 9/1996 | Miyaji et al. .................. 355/73 |
| 5,602,683 | A | | 2/1997 | Straaijer et al. ............. 359/811 |
| 5,909,030 | A | * | 6/1999 | Yoshitake et al. ........ 250/492.2 |
| 5,932,380 | A | | 8/1999 | Yaegashi et al. .............. 430/30 |
| 5,980,187 | A | * | 11/1999 | Verhovsky ............. 414/416.03 |
| 6,027,262 | A | | 2/2000 | Akimoto ...................... 396/611 |
| 6,208,406 | B1 | | 3/2001 | Nakashima .................. 355/30 |
| 6,335,787 | B1 | | 1/2002 | Nishi ........................... 355/67 |
| 6,356,338 | B2 | * | 3/2002 | Arakawa ...................... 355/30 |
| 6,590,631 | B2 | * | 7/2003 | Miwa et al. .................. 355/30 |

FOREIGN PATENT DOCUMENTS

| JP | 6-176998 | * | 6/1994 |
| JP | 6-216000 | | 8/1994 |

* cited by examiner

*Primary Examiner*—Alan Mathews
(74) *Attorney, Agent, or Firm*—Fitzpatrick, Cella, Harper & Scinto

(57) ABSTRACT

An exposure apparatus for transferring a pattern of a mask onto a substrate. The apparatus includes a door and a sensor for detecting ozone in a space enclosed by the door. Opening of the door is prohibited when ozone concentration detected by the sensor is not less than a predetermined value.

11 Claims, 4 Drawing Sheets

EXPOSURE APPARATUS AND MANUFACTURING METHOD USING THE SAME

This application is a divisional application of U.S. patent application Ser. No. 09/274,112, filed Mar. 23, 1999, now U.S. Pat. No. 6,590,631.

FIELD OF THE INVENTION AND RELATED ART

This invention relates to an exposure apparatus to be used with an exposure beam of ultraviolet rays, such as an excimer laser, for example, and also to a device manufacturing method using such an exposure apparatus.

In projection exposure apparatuses for the manufacture of semiconductor integrated circuits, light of various wavelength regions is projected as an exposure beam to a substrate. Examples of such an exposure beam used are e-line (wavelength $\lambda=546$ nm), g-line ($\lambda=436$ nm), h-line ($\lambda=405$ nm), i-line ($\lambda=365$ nm), KrF excimer laser ($\lambda=248$ nm), ArF excimer laser ($\lambda=193$ nm) and X-rays.

An exposure beam emitted from a light source goes through an illumination optical system for illuminating a mask or reticle, and a projection optical system (projection lens) for imaging a fine pattern, formed on the mask, whereby the fine pattern is lithographically transferred to a photosensitive substrate. In such exposure apparatuses, the linewidth of a pattern becomes smaller and smaller, and this has forced further improvement of throughput and resolution. Also, this requires a large power exposure beam. Simultaneously, the bandwidth of a wavelength of the exposure beam should be narrowed.

It is known that, when an exposure beam of i-line or a wavelength shorter than it is used, due to the band-narrowing, impurities in the air photochemically react with oxygen to cause deposition of compositions (blurring material) produced by the reaction upon optical elements (lenses or mirrors) of the optical system. This produces non-transparent "blur".

A representative example of such a blurring material is ammonium sulfate $(NH_4)_2SO_4$, resulting from that, when sulfurous acid, for example, absorbs energies of light and is excited thereby, it reacts with oxygen in the air (i.e., oxidized). The ammonium sulfate is colored white so that, when it is deposited on an optical member such as a lens or mirror, it causes "blur". Then, the exposure beam is scattered or absorbed by ammonium sulfate and, as a result, the transmission factor of the optical system decreases. This causes a reduction of light quantity (transmission factor) reaching the photosensitive substrate, and a decrease of throughput.

As a solution for this problem, Japanese Laid-Open Patent Application, Laid-Open No. 216000/1994 shows an apparatus wherein a barrel comprises a casing of a closed structure having glass members such as lenses accommodated therein, and wherein the inside of the casing is filled with an inert gas.

As regards an illumination optical system for illuminating a mask with a laser light source and a projection optical system for projecting the pattern of the mask in a reduced scale, enclosing optical components such as lenses by a tightly closed container and purging the inside of the container with an inert gas, may be accomplished relatively easily. However, as regards the mask and the substrate, particularly, the substrate has to be changed frequently. From the standpoint of throughput, therefore, it is practically difficult to place the substrate in a space purged by an inert gas. The space around the substrate inevitably contains air. When oxygen $(O_2)$ in the air absorbs the exposure beam, ozone $(O_3)$ is produced.

Generally, a temperature control system for the major assembly of the apparatus is structured to circulate a portion of the air conditioning gas, not to discharge all the gas outside the apparatus. Therefore, ozone successively produced in response to exposures remain in the temperature control system, and the ozone density in the apparatus gradually increases to some extent. As a result of it, the surfaces of components of the apparatus are corroded to damage the function. Further, a high ozone density environment is not good for operators.

In deep ultraviolet rays such as an excimer laser of having a wavelength of 250 nm or shorter than this, particularly, an ArF excimer laser having a wavelength of about 193 nm, there are plural oxygen $(O_2)$ absorbing zones in the bandwidth near the wavelength described above. Thus, in response to absorption of light by oxygen, ozone is generated. The above-described problem is, therefore, quite notable in the wavelength range of 250 nm or less.

SUMMARY OF THE INVENTION

It is an object of the present invention to provide an exposure apparatus of high durability by which the problem of deterioration of components by the production of ozone, which is quite notable in the wavelength region of 250 nm, is overcome.

It is another object of the present invention to provide a device manufacturing method which is based on such an exposure apparatus.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be described in conjunction with the drawings.

Figure 1:
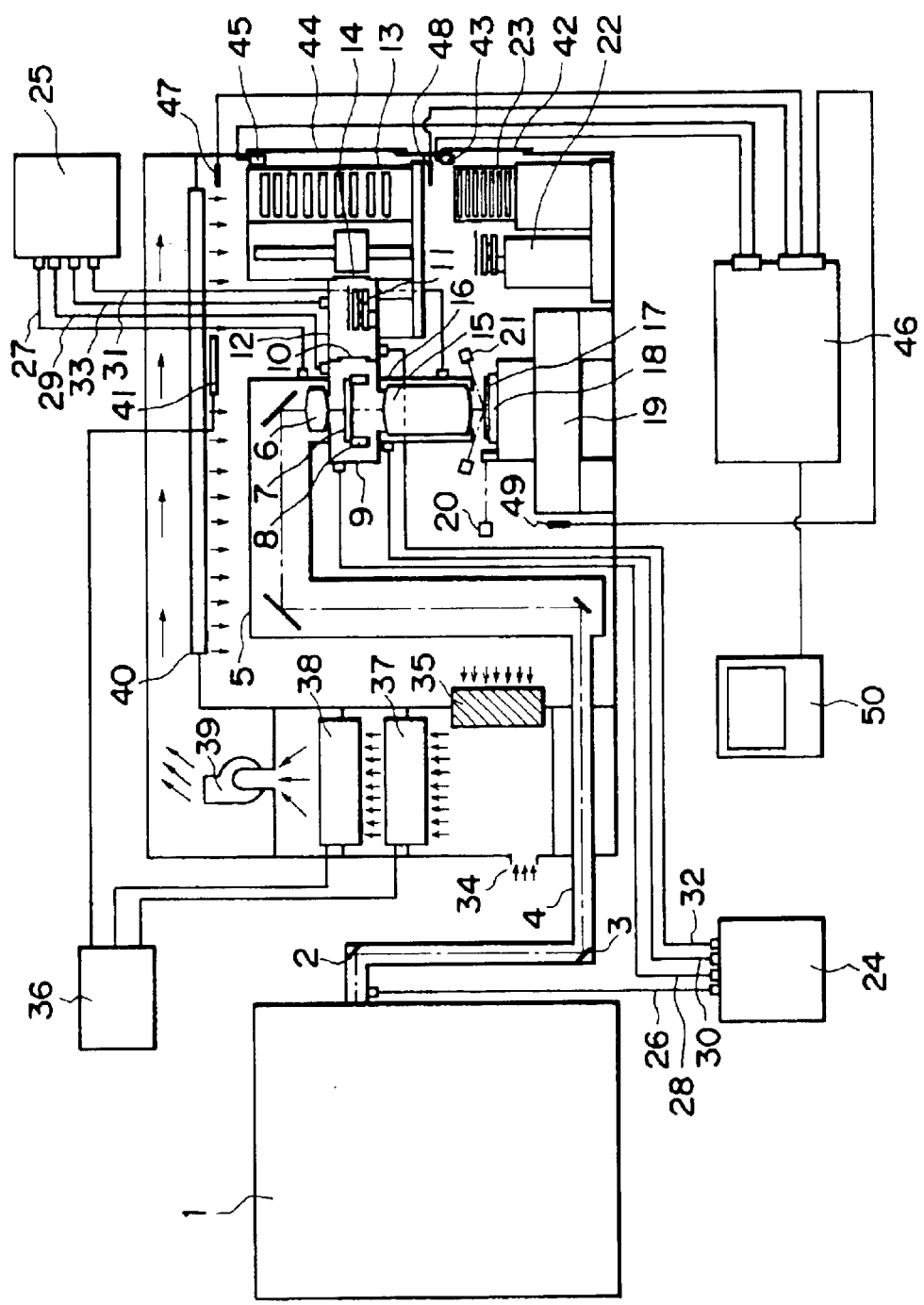
FIG. 1 is a schematic view of a general structure of a projection exposure apparatus according to an embodiment of the present invention.

FIG. 1 is a schematic view of a general structure of a projection exposure apparatus according to an embodiment of the present invention. Laser device 1, which provides a light source for the exposure apparatus, is disposed separately from the exposure apparatus. The laser device comprises an excimer laser device for producing deep ultraviolet light of a wavelength region not longer than 250 nm. In this embodiment, it uses an ArF excimer laser having an emission wavelength of about 193 nm. However, in place of it, a KrF excimer laser having an emission wavelength of about 248 nm or, alternatively, EUV or soft X-rays of a much shorter wavelength may be used.

The laser beam emitted from the laser device 1 is introduced via mirrors 2 and 3 into the exposure apparatus major assembly. The portion around the path, including the mirrors 2 and 3, is isolated by a light isolating tube 4 of a closed structure, from the outside gas. The introduced laser beam is directed to an illumination optical system 5 so that, through accommodated mirrors and optical elements (not shown), a predetermined region on a mask 7 (or reticle) is illuminated uniformly. A final lens 6 is disposed at the exit of the illumination optical system. The path from the emission point of the laser device 1 to the final lens 6 is formed with an integral closed structure by which communication with outside gas is intercepted. The inside of the structure is filled with an inert gas, to be described later.

The mask 7 is placed on a mask holder 8 and it is positioned by a mask stage. The mask 7 and the mask holder 8 are enclosed by a sealed casing 9. Also, a mask changing means 11 is encircled by a sealed casing 12. There is a mask library 13 for accommodating plural masks therein. Each mask can be taken out of the mask library by the mask changing means 11, and it is conveyed to an exposure station by the mask holder 8. Two sealed casings 9 and 12 are separated by an opening/closing means 10 of high gas-tightness, having a door. Similarly, there is another opening/closing means 14 between the sealed casing 12 and the library 13.

The projection optical system includes lens groups 15, and it functions to project a circuit pattern of the mask 7 onto a substrate (e.g., a semiconductor wafer) 17 coated with a photosensitive material, at a predetermined magnification. The lens groups 15 of the projection optical system are accommodated in a sealed casing 16, being filled with an inert gas and being gas-tightly sealed.

The substrate 17 is held by a chuck 18 by vacuum attraction. The chuck 18 is mounted on a substrate stage 19 for positioning the chuck. There are a laser interferometer 20 and an alignment optical system 21, for measuring the position of the substrate 17 held by the chuck 18. Replacement of the substrate 17 is performed by substrate changing means 22. It functions to change the substrate upon the chuck 18 with one of the substrates in a substrate container 23 for accommodating plural substrates therein.

For replacement of the substrate container 23 from the outside, a door 42 is provided at the exposure chamber side of the exposure apparatus major assembly. The door 42 is openable and closeable for the replacement. However, there is an interlocking mechanism 43 for holding the door unopenable during the exposure, for safety. Similarly, there is a door 44 for replacement of the masks in the library. There also is an interlocking mechanism 45 for holding the door 44 unopenable during the exposure.

Inert gas supplying means 24 supplies an inert gas, which is distributed along four channels. These channels will be described below. The first channel extends along a piping system 26, and the gas is introduced into the light isolating tube 4 in the vicinity of the exit of the laser device 1. The gas flows along the tube 4 and the light path of the illumination system 5 and, from the vicinity of the final lens 6 and through a piping system 27, it is discharged toward gas discharging means 25. The second channel extends along a piping system 28, and the gas is introduced into the sealed casing 9 of the mask. Through a piping system 29, the gas is discharged toward the gas discharging means 25. The third channel extends along a piping system 30, and the gas is supplied to one end of the sealed casing 16. The gas flows through the lens groups 15 of the inside projection optical system and then, through a piping system connected to the other end, the gas is discharged toward the gas discharging means 25. The fourth channel extends along a piping system 32, and the gas is supplied into the sealed casing 12. Via a piping system 33, the gas is discharged toward the gas discharging means 25.

Next, a description will be made of an air conditioning system of the exposure apparatus major assembly, which is an important features of this embodiment. The exposure apparatus major assembly is provided with an outside gas inlet port 34 for introducing the outside gas. Also, at the inlet from the exposure chamber to the air conditioning chamber, there is an ozone converter for converting ozone ($O_3$) into oxygen ($O_2$). The ozone converter 35 may comprise activated charcoal, for example, for converting ozone into oxygen in accordance with the conversion principle based on chemical reaction, to thereby remove ozone. The converting capacity of this ozone converter 35 is variable, to be described later, and the removing capacity can be increased when the ozone density becomes higher.

The flow of conditioning gas is created by operation of a fan 39. It operates to produce circulation of the gas to be introduced from the exposure chamber via the ozone converting means 35, and suction of gas from the outside gas inlet port 34. A freezer 37 and a heater 38 are controlled by control means 36 in accordance with a temperature measured by a temperature monitor 41, so as to maintain, constant, the temperature of the gas to be discharged into the exposure chamber through a filter 40, for filtering fine particles or chemical substances.

There are ozone density sensors 47, 48 and 49 disposed at three locations inside the exposure chamber, for measuring the ozone density at respective positions. On the basis of the measurement results at the ozone density sensors 47–49 and in accordance with the exposure sequence, the control means 46 controls opening/closing of the interlocking mechanisms 43 and 45 for the two doors. Also, connected to the control means 46 is an ozone density display device 50 for continuously displaying the inside ozone density of the apparatus, or it operates to display the information to the operator as required. The control means 46 further functions to control and to increase the conversion capacity of the ozone converter 35 if at least one of the ozone density sensors 47–49 detects an increase of ozone density.

This embodiment provides a safety mechanism which operates so that, only when the exposure operation is not performed and when the ozone density is lower than a predetermined level, the interlocking mechanisms 43 and 45 are released to allow opening of the doors 42 and 44. As a result, in the course of the sequence or when the ozone density is higher than the predetermined level, the interlocking action functions to prohibit access to the inside of the apparatus for enhanced safety. Since ozone is produced only during the exposure operation, the ozone density decreases gradually through the circulation system of the air conditioning system. When the ozone density is lowered to a predetermined level, the interlocking mechanisms are released, and the access to the inside of the apparatus is allowed.

The ozone, which is produced during the exposure operation and, particularly, from the light path adjacent to the substrate 17, or the ozone emitted when the opening/closing means 14 is placed in a communication state, is converted by the converting means 35 into oxygen, whereby the ozone is removed. Therefore, there is no possibility of ozone remaining and staying in the gas circulation path inside the apparatus.

Figure 2:
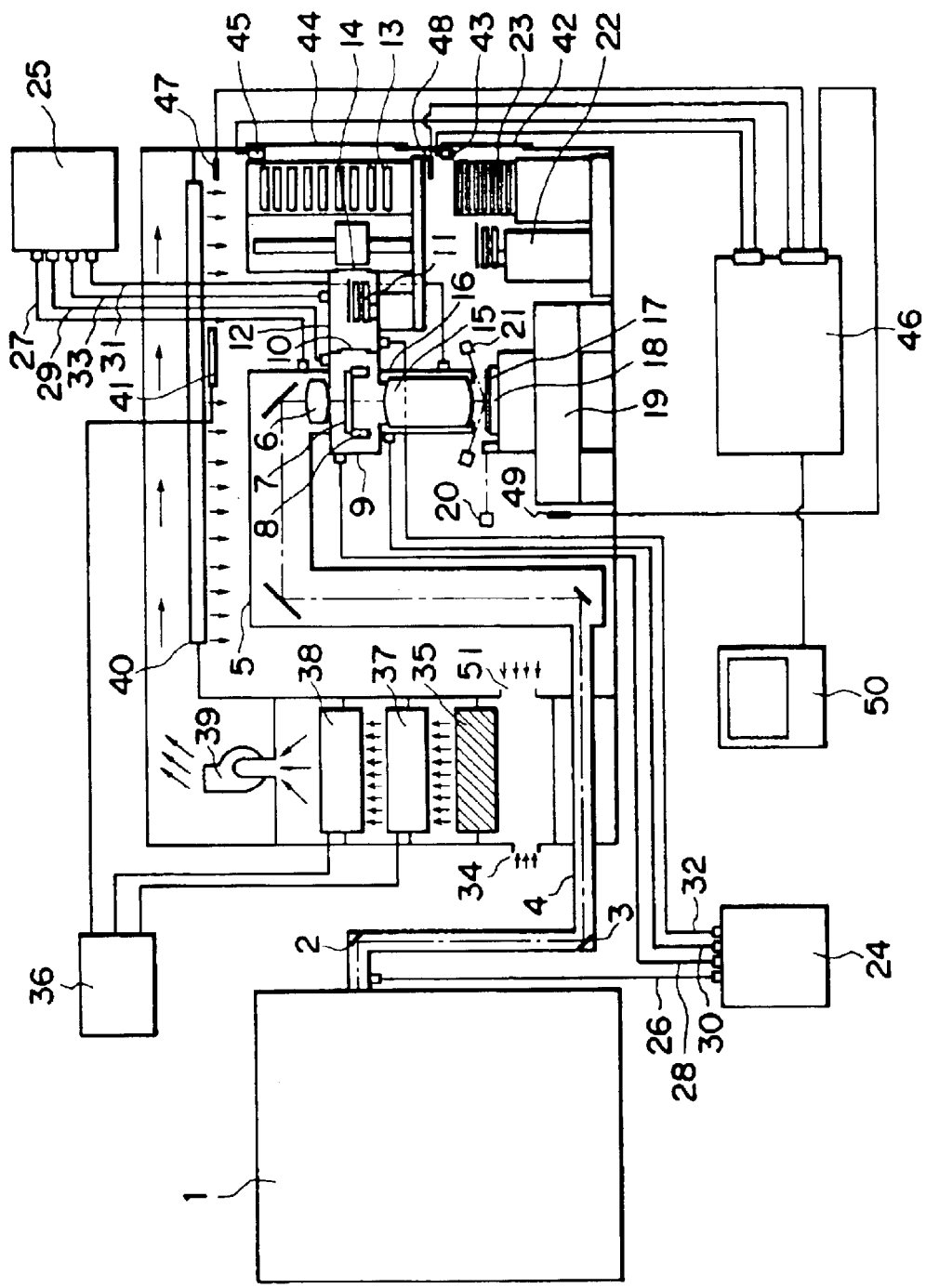
FIG. 2 is a schematic view of a modified form of the FIG. 1 embodiment.

A modified form of this embodiment will now be described with reference to FIG. 2. Like numerals are assigned to corresponding elements, and a detailed description thereof will be omitted. The distinction over the preceding embodiment resides in that the ozone converter 35 is disposed just before the freezer 37. As a result of this, gasses from both an outside gas inlet port 34 and an air conditioning gas returning port 51 pass through the ozone converter 35, whereby ozone is removed. Since there is a possibility that the ambience gas in a clean room of a semiconductor manufacturing factory where an exposure apparatus is placed contains a small amount of ozone, this structure is effective to remove ozone, as much as possible, in the gas to be introduced and circulated.

As regards the position of the ozone converter 35, in place of those described in the preceding examples, it may be disposed at a described position inside the gas circulation system of the air conditioning system. Further, the number of the ozone converter 35 is not limited to one, and plural converters may be disposed at different locations.

As described above, the ozone produced in response to projection of an exposure beam is converted into oxygen whereby ozone inside the exposure apparatus is removed. Thus, deterioration of components used in the apparatus is prevented, such that an exposure apparatus of high durability is accomplished. Further, the interlocking mechanism operates in response to the detection of ozone or the information is displayed to the operator. This ensures high safety to the operator.

Next, an embodiment of a semiconductor device manufacturing method, which uses a projection exposure apparatus according to any one of the preceding embodiments, will be explained.

Figure 3:
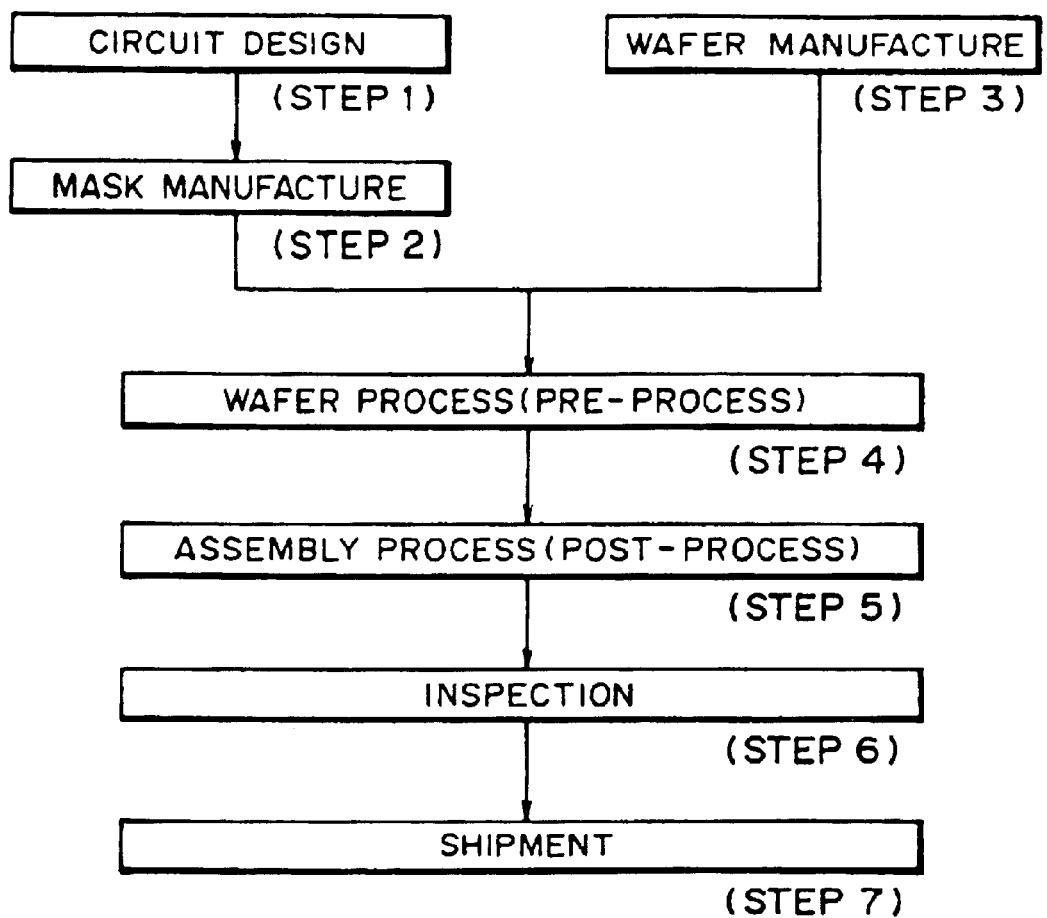
FIG. 3 is a flow chart of semiconductor device manufacturing processes.

FIG. 3 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the so prepared mask and wafer, circuits are practically formed on the wafer through lithography. Step 5 subsequent to this is an assembling step, which is called a post-process, wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 4:
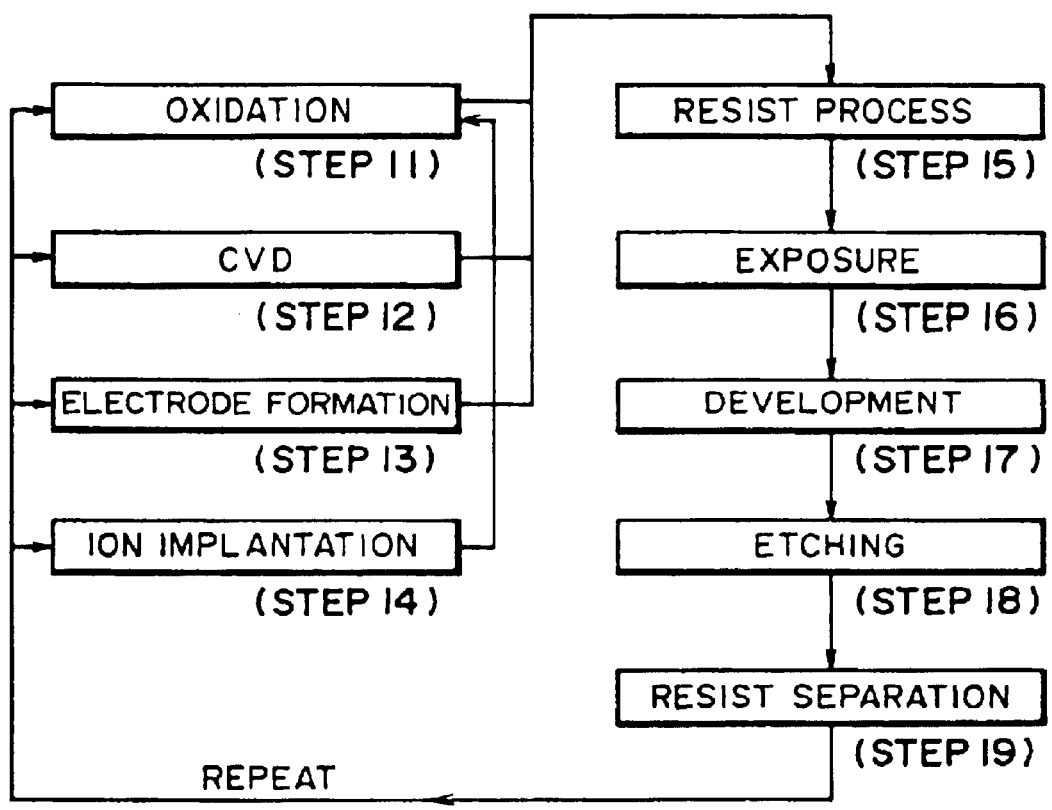
FIG. 4 is a flow chart of a substrate process.

FIG. 4 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (e.g., a photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In an exposure apparatus according to the embodiments of the present invention described above, ozone produced in response to projection of an exposure beam can be removed, whereby deterioration of components used in the apparatus can be prevented. Thus, an exposure apparatus of high durability is accomplished. Further, detection of ozone is effective to assure enhanced safety of the apparatus. Since ozone production is quite notable for an exposure beam having a wavelength of 250 nm or shorter, the advantageous effects described above are very significant, particularly when an ArF excimer laser is used with a wavelength region of 250 nm or less.

Use of such an exposure apparatus enables the production of high precision devices with lower cost.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern of a mask onto a substrate, said apparatus comprising:
    a projection optical system for projecting an image of the pattern upon the substrate;
    a casing for surrounding said projection optical system;
    ozone removing means for removing ozone in a mixed gas being provided by mixing an exhausted gas from the inside of said casing with an external gas supplied from the outside of said casing; and
    gas circulating means for supplying a supply gas, provided by said ozone removing means, into said casing.

2. An apparatus according to claim 1, further comprising inactive gas supplying means for supplying an inactive gas into the inside of said projection optical system.

3. An apparatus according to claim 2, wherein said inactive gas supplying means also supplies an inactive gas into a space that surrounds the mask.

4. An apparatus according to claim 3, further comprising a mask library for accommodating a plurality of masks therein, said mask library being disposed in said space that surrounds the mask.

5. An apparatus according to claim 1, wherein the mixed gas is temperature regulated and then is supplied into the inside of said casing.

6. An apparatus according to claim 1, wherein said ozone removing means includes a converter for converting ozone into oxygen.

7. An apparatus according to claim 6, wherein said converter has activated carbon and operates to convert ozone into oxygen by use of the activated carbon.

8. An apparatus according to claim 1, further comprising an ArF excimer laser as a light source for illuminating the pattern.

9. An apparatus according to claim 1, further comprising detecting means for detecting an ozone concentration in said casing.

10. An apparatus according to claim 9, further comprising changing means for changing an ozone removing capacity of said ozone removing means on the basis of the detection by said detecting means.

11. A device manufacturing method comprising the steps of:
    exposing a substrate by use of an exposure apparatus as recited in claim 1; and
    developing the exposed substrate.

* * * * *

UNITED STATES PATENT AND TRADEMARK OFFICE
CERTIFICATE OF CORRECTION

PATENT NO. : 6,762,822 B2
DATED : July 13, 2004
INVENTOR(S) : Yoshinori Miwa et al.

It is certified that error appears in the above-identified patent and that said Letters Patent is hereby corrected as shown below:

Title page,
Item [75], Inventors, "Yoshinori Miwa, Tokyo (JP);" should read -- Yoshinori Miwa, Utsonomiya (JP); --.

Column 1,
Line 43, "it" should read -- sulfurous acid --.

Column 2,
Line 9, "remain" should read -- remains --.
Line 15, "of" should be deleted.

Column 4,
Line 5, "features" should read -- feature --.

Signed and Sealed this

Fifth Day of April, 2005

JON W. DUDAS
*Director of the United States Patent and Trademark Office*